United States Patent [19]

Collins

[11] Patent Number: 5,262,754

[45] Date of Patent: Nov. 16, 1993

[54] OVERVOLTAGE PROTECTION ELEMENT

[75] Inventor: Christopher J. Collins, Alameda, Calif.

[73] Assignee: Electromer Corporation, Palo Alto, Calif.

[21] Appl. No.: 949,709

[22] Filed: Sep. 23, 1992

[51] Int. Cl.$^5$ .............................................. H01C 7/10
[52] U.S. Cl. ...................................... 338/21; 338/20
[58] Field of Search .................................. 338/20, 21

[56] References Cited

U.S. PATENT DOCUMENTS

| | | |
|---|---|---|
| 1,452,574 | 8/1923 | Slepian ................................. 338/20 |
| 2,707,223 | 4/1955 | Hollmann ........................ 338/20 X |
| 3,212,043 | 10/1965 | Johnson ................................ 338/20 |
| 3,685,026 | 8/1972 | Wakabayashi et al. .......... 338/20 X |
| 4,726,991 | 2/1988 | Hyatt et al. ..................... 338/20 X |
| 4,977,357 | 12/1990 | Shrier ................................... 338/21 |

Primary Examiner—Marvin M. Lateef
Attorney, Agent, or Firm—Flehr, Hohbach, Test, Albritton & Herbert

[57] ABSTRACT

An overvoltage protection element which comprises a sheet of insulating material of predetermined thickness having openings extending therethrough and non-linear material filling said holes.

8 Claims, 4 Drawing Sheets

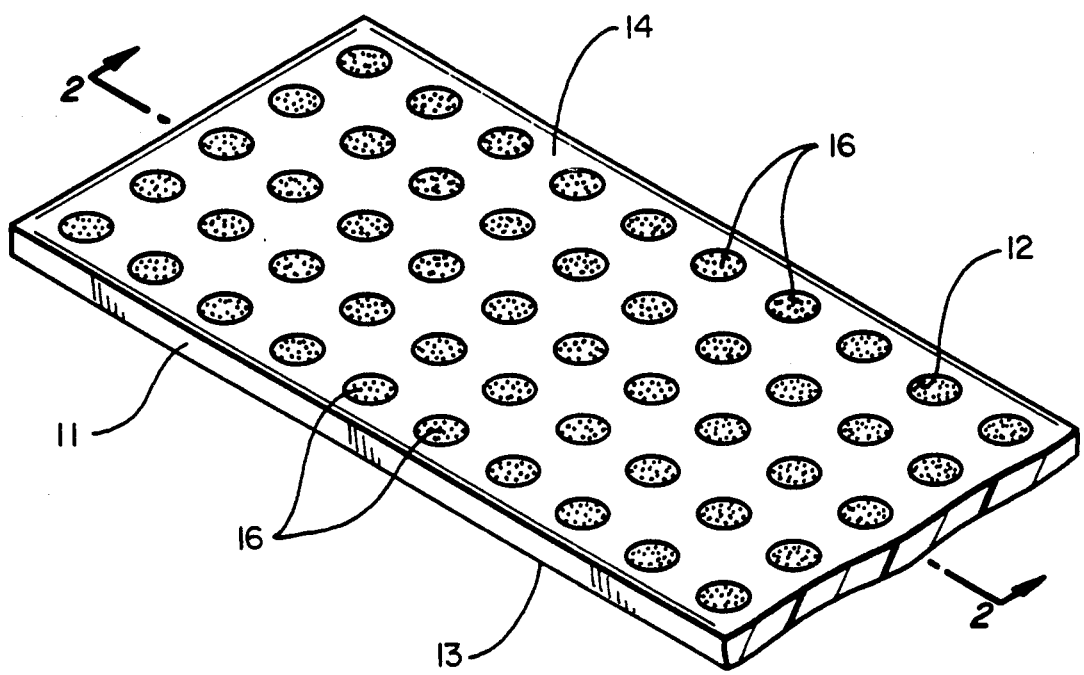
FIG_1
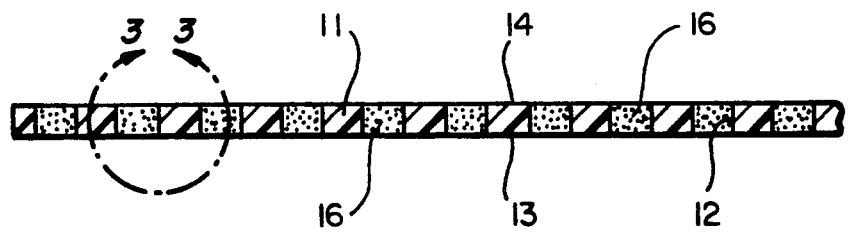
FIG_2

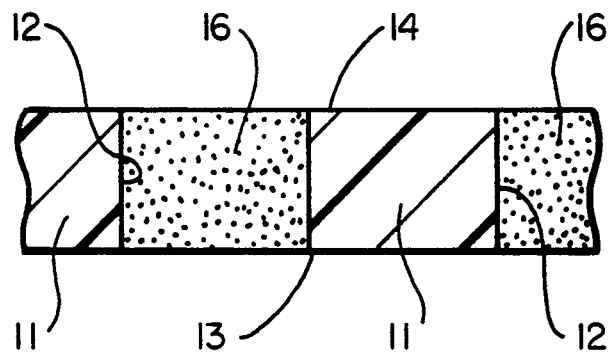
FIG_3
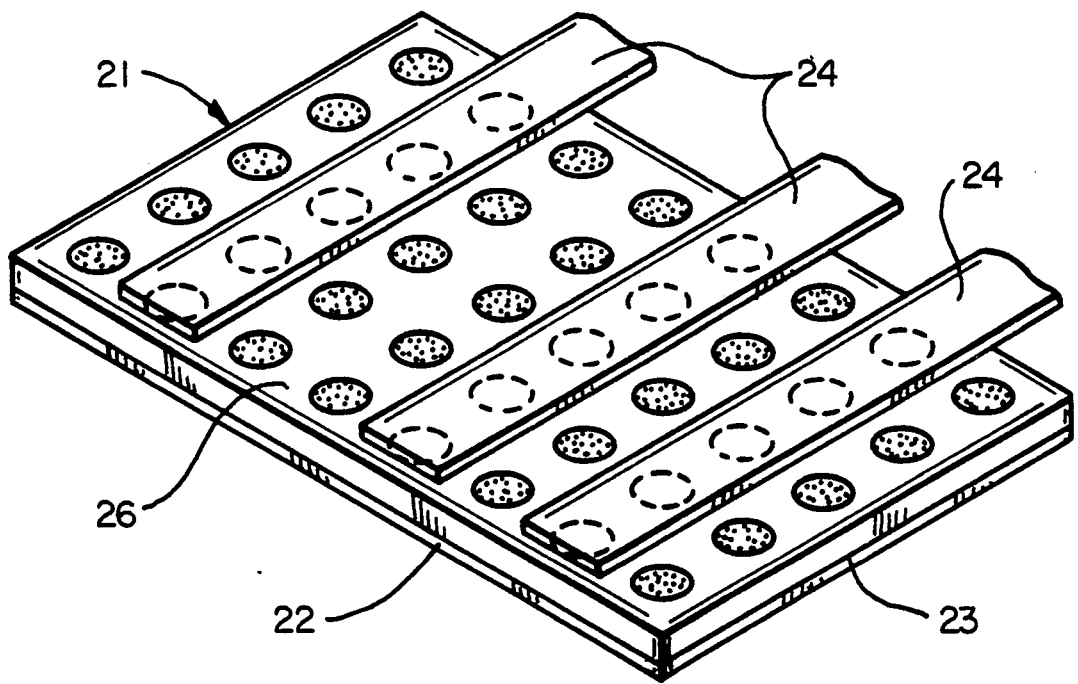
FIG_4

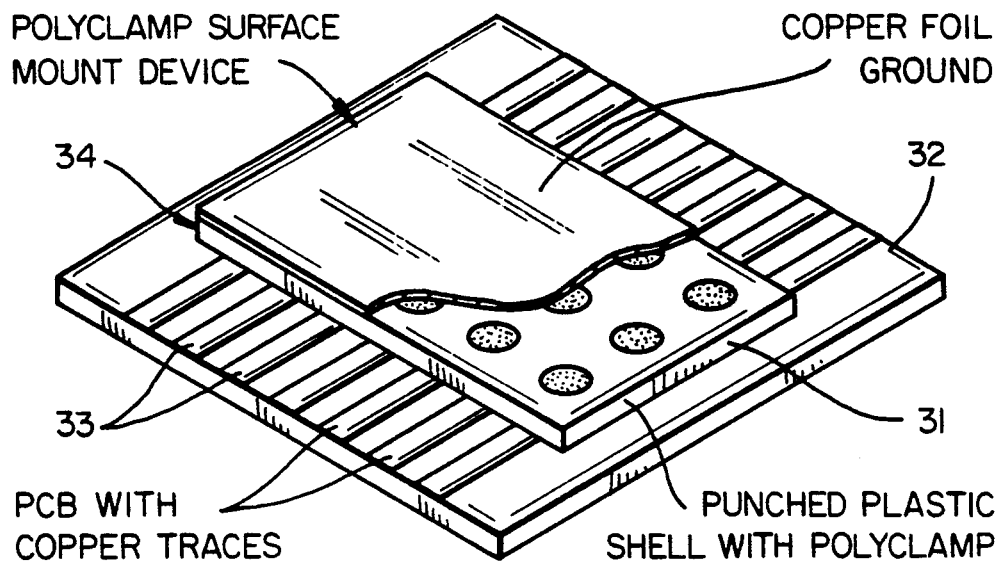
FIG_5
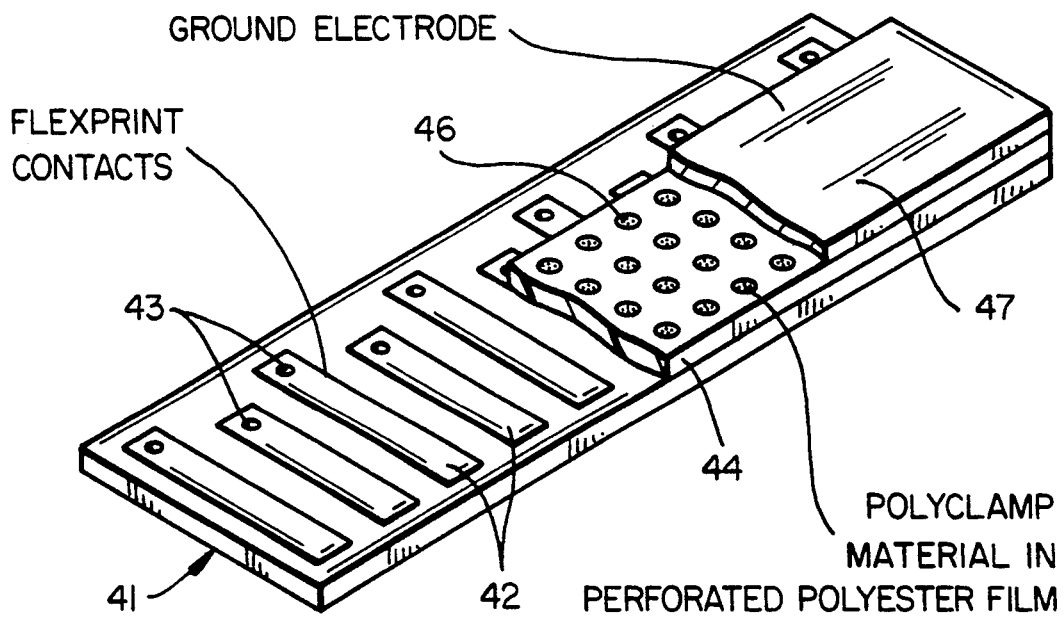
FIG_6

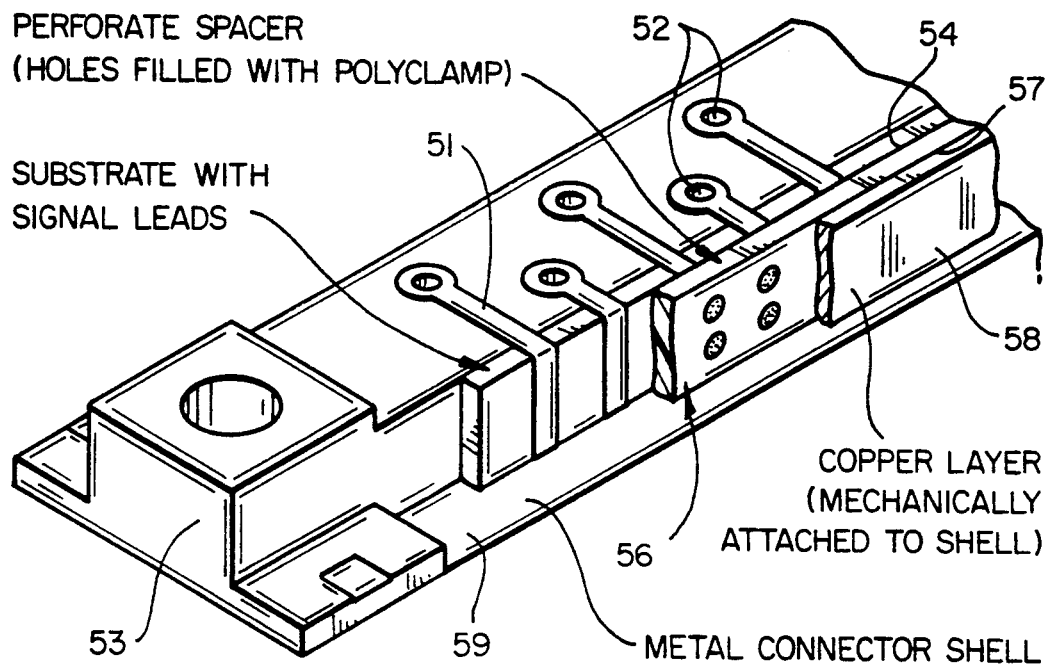
FIG_7
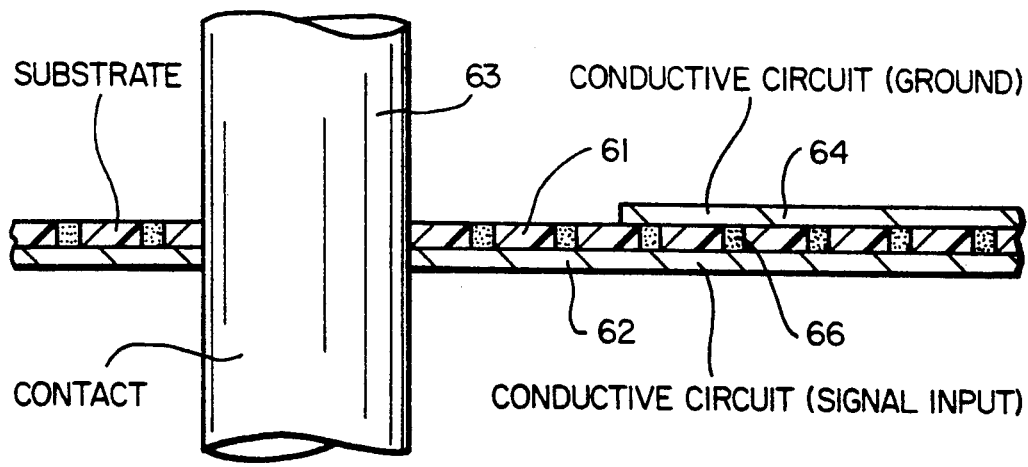
FIG_8

OVERVOLTAGE PROTECTION ELEMENT

FIELD OF THE INVENTION

This invention relates generally to an overvoltage protection element, and more particularly to an overvoltage protection element which can replace discrete devices presently used in protecting electronic circuits from disruptive and/or damaging effects of overvoltage transients.

BACKGROUND OF THE INVENTION

There are a number of devices which use materials having non-linear electrical response (hereinafter non-linear material) for overvoltage protection. These devices use non-linear material comprising finely divided particles dispersed in an organic resin or insulating medium. The material is placed between contacts and responds or switches at predetermined voltages. U.S. Pat. No. 4,977,357 is directed to such a material which can be placed between and in contact with spaced conductors to provide a non-linear resistance therebetween; the material comprises a matrix comprised of a binder and closely spaced conductive particles uniformly dispersed in the binder. U.S. Pat. No. 4,726,991 is directed to a switching material which provides electrical overstress protection against electrical transients, the material being formed of a matrix comprising separate particles of conductive materials and semi-conductive materials, all bound in an inorganic insulating binder to form the switching matrix. U.S. Pat. No. 3,685,026 describes a switching device employing a non-linear material. In all such devices, the matrix has been applied between electrodes by forming the matrix material into the space between the electrodes, by applying a coating of the material to one electrode and then applying the second electrode, or by extruding, rolling/calendaring, pressing or molding the material into a thin sheet which is then sandwiched between electrodes. In all such methods, it is difficult to precisely achieve the desired thickness of the non-linear material and to provide intimate contact with the associated electrodes.

There is a need to provide an overvoltage protection element which can be integrated into connectors or electronic circuits at a lower cost than the use of discrete services such as clamping diodes. There is also a need for such a device which can be used in connection with multiple lines and which has low capacitance compared with diodes, thereby providing less interference with transmitted electrical signals.

OBJECTS AND SUMMARY OF THE INVENTION

It is a general object of this invention to provide an improved overvoltage protection element having non-linear characteristics.

It is a further object of this invention to provide an overvoltage protection element which allows high volume multi-line package designs to be implemented for specific applications in connectors and electronic systems.

It is still a further object of this invention to provide an overvoltage protection element which includes a woven substrate having first and second major spaced surfaces with perforations extending between said surfaces and with the perforations filled with nonlinear material to extend from one surface of the substrate to the other.

It is a further object of this invention to provide an overvoltage protection element which allows high volume multi-line package designs to be implemented for specific applications.

It is a further object of this invention to provide an overvoltage protection element in which the electrical characteristics can be closely controlled by controlling the spacing between said major surfaces.

The foregoing and other objects of the invention are achieved by a circuit element that provides protection from fast transient voltages. The element includes a layer of insulating material having first and second spaced major surfaces spaced a predetermined distance to determine the thickness of the element, a plurality of spaced holes extending between the major surface, and a non-linear overvoltage protection material contained within the holes formed in the layer and extending between said spaced major surface.

BRIEF DESCRIPTION OF THE DRAWINGS

These and other objects of this invention will be more clearly understood from the following detailed description when taken in conjunction with the drawings, wherein:

FIG. 1 is a perspective view of an overvoltage protection element in accordance with this invention;

FIG. 2 is a view taken along the line 2—2 of FIG. 1;

FIG. 3 is an enlarged view taken along the line 3—3 of FIG. 2;

FIG. 4 shows the overvoltage protection element forming part of a device for multi-line overvoltage protection;

FIG. 5 is a perspective view of an overvoltage protection element associated with a multiple line printed circuit board;

FIG. 6 shows the overvoltage protection element in a connector arrangement;

FIG. 7 shows the overvoltage protection device associated with another connector arrangement; and FIG. 8 shows the overvoltage protection element associated with one of multiple conductors.

DESCRIPTION OF THE PREFERRED EMBODIMENT

The overvoltage protection element includes a sheet, layer or member 11, having spaced major surfaces which, as will be described, is selected to be of predetermined thickness. The sheet is formed of any electrically insulating material including, but not limited to, polymers including thermoplastic materials polyethylene, polypropylene, polyester, polymids, elastomers, natural and synthetic rubbers, silicon rubber, thermosetting materials, epoxies, ceramics or glass.

The primary consideration in selecting the sheet or member is that it have good electrical insulating properties and that it be easy to handle and process. The sheet 11 is provided with a plurality of holes or openings 12 which extend from the bottom surface 13 to the top surface 14. Preferably, as will be herein described, the hole size should be wider than about one-half the width of the associated electrical circuit. The hole shape may be a circular cylinder, although holes of other shapes and sizes can be used. The shape and sizes of the hole will be, in part, dictated by methods of perforating the sheet of material. Holes having open areas of between 0.0003 and 0.20 square inches are suitable. The holes can be made by mechanical punching, laser processing and cutting, chemical etching, etc. Each of these and other methods of forming holes which extend through the sheet is dependent on the material used to form the sheet.

In accordance with this invention, the sheet is selected to have a predetermined thickness and the holes are filled with a suitable non-linear switching material of the type described in the patents referred to above, and preferably, a material such as taught in U.S. Pat. No. 4,977,357, comprising a binder and closely spaced conductive particles homogeneously distributed in said binder and spaced to provide electrical conduction by quantum mechanical tunneling. The material extends between the two major surfaces. The holes may be filled by a variety of methods including calendaring, pressing, laminating, molding, extruding, dipping, wiping, painting, rolling, etc. The only requirement is that the holes be completely filled so that the material extends coplanar with the upper and lower surfaces of the sheet. The size of the holes should be such that for the particular application under consideration, there is a sufficient volume of material to carry the currents which are induced under an overvoltage condition.

It is to be observed that the overvoltage protection element can be formed in large sheets which can then be cut up for specific applications. The breakdown characteristic of the element are controlled by the type of non-linear material used and the thickness of the sheet or member 11; that is, the spacing between the major surfaces. The greater the thickness, or spacing, the higher the voltage required to cause switching. Thicknesses between 0.001 and 0.10 inches are satisfactory.

FIG. 4 shows a piece cut from a sheet to form element 21. A conductive ground plane 22 is affixed to the underside of the sheet in conductive contact with the non-linear material extending to the lower surface 23. A plurality of separate leads 24 are applied to the upper surface 26 to be in intimate contact with the non-linear material extending to that surface. As shown, the dotted circles show the non-linear material in contact with the electrodes 24. The electrodes 24 extend beyond the element and can be connected to electrical circuits. The bottom plate 22 can be grounded whereby excessive voltage on any of the associated electrical leads 24 causes switching of the material between the corresponding electrode 24 and ground. The leads 24 and ground plane 22 can be laminated to the element 21 by heat and pressure. Alternative conductive adhesives may be applied to the surfaces and the leads and member adhered to the surface in electrical contact with the non-linear material. An alternative would be to mechanically impress the conductive traces 24 and ground plane 22 to the element 21. The leads or traces 24 may be formed by printed wiring techniques. That is, a sheet of conductive material may be applied and placed in intimate contact with the upper surface. Then by photolithographic techniques, selected regions of the conductive material are exposed whereby they may be etched away by acid or the like to leave traces 24.

Referring to FIG. 5, an element 31 is placed on the surface of a printed circuit board 32 which includes electrical leads or traces 33. The upper surface of the element 31 is covered with a conductive layer 34 which can be connected to ground, thereby switching excess voltage on any of the leads 33 to the ground plane through the nonlinear perforated overvoltage protection material.

In FIG. 6 there is shown a printed circuit board 41 having conductive traces or leads 42 terminating in holes 43 for connection to associated electrical leads. Overlying the printed circuit conductors is an element 44 including the nonlinear material 46. A ground plane 47 is in conductive contact with the nonlinear material 46. In this manner, when overvoltages are applied to the leads associated with the holes 43, the non-linear material switches to connect the leads to the ground plane and divert excessive currents to ground plane 47.

In the embodiment of FIG. 7, the conductors 51 associated with the lead holes 52 are wrapped over the side of the insulating block 53 and cooperate with one surface 54 of the overvoltage protection element 56 with the other surface 57 connected to a ground plane 58. The insulating block is supported in a metal shell 59.

In FIG. 8, there is shown a sheet of overvoltage protection material 61. A conductive sheet 62 is applied to one surface in intimate contact with the lead 63. The other surface of the overvoltage element is provided with a conductive ground plane 64. Thus, when excessive voltages are applied to the lead, the voltages serve to switch the nonlinear material 66 and thereby connect the lead directly to ground, protecting the associated equipment.

Thus, there has been provided an overvoltage protection element formed from an impregnated fabric which is easy to manufacture and to control the electrical characteristics. The element is adaptable for many applications for a multi-line circuit protection such as in connectors, printed circuit boards, and the like.

I claim:

1. An overvoltage protection element comprising
   a sheet of insulating material having first and second parallel spaced major surfaces which determine the thickness of the element,
   a plurality of spaced openings in said sheet which extend from one major surface to the other major surface, and
   a non-linear electrical switching material filling the holes and extending between the first and second spaced major surface of said sheet.

2. An overvoltage protection element as in claim 1 including a conductive ground plane on one of said major surfaces in conductive contact with the non-linear material.

3. An overvoltage protection element as in claim 1 in which the first and second major surfaces are spaced a predetermined distance to establish the voltage breakdown characteristics of said element.

4. An overvoltage protection element as in claim 1 in which the sheet of insulating material is a material selected from the group including polymers, thermoplastics, silicon and fluoro-silicon polymers, elastomers, rubbers, thermosetting materials, epoxies, ceramics or glass.

5. An overvoltage protection element as in claim 1 in which the non-linear material comprises a binder and closely spaced conductive particles homogeneously distributed in said binder and spaced to provide conduction by quantum mechanical tunneling.

6. An overvoltage protection element as in claim 1 in which the holes have an open area of between 0.0003 and 0.20 square inches.

7. An overvoltage protection element as in claim 1 in which the first and second major surfaces are spaced between 0.001 to 0.100 inches.

8. An overvoltage protection element as in claim 6 in which the first and second major surfaces are spaced between 0.001 and 0.100 inches.

* * * * *